(12) United States Patent
Zhang

(10) Patent No.: US 9,299,299 B2
(45) Date of Patent: Mar. 29, 2016

(54) ARRAY SUBSTRATE, PSAV LIQUID CRYSTAL DISPLAY PANEL AND MANUFACTURING METHOD THEREOF

(71) Applicant: Shenzhen China Star Optoelectronics Technology Co., Ltd., Shenzhen, Guangdong (CN)

(72) Inventor: Xin Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 633 days.

(21) Appl. No.: 13/695,299

(22) PCT Filed: Oct. 18, 2012

(86) PCT No.: PCT/CN2012/083143
§ 371 (c)(1),
(2) Date: Oct. 30, 2012

(87) PCT Pub. No.: WO2014/056244
PCT Pub. Date: Apr. 17, 2014

(65) Prior Publication Data
US 2014/0104251 A1    Apr. 17, 2014

(51) Int. Cl.
G09G 3/36        (2006.01)
H01L 33/58       (2010.01)
G09G 3/00        (2006.01)
G02F 1/1362      (2006.01)

(52) U.S. Cl.
CPC ........ *G09G 3/3611* (2013.01); *G02F 1/136259* (2013.01); *G09G 3/006* (2013.01); *G09G 3/3648* (2013.01); *H01L 33/58* (2013.01); *G02F 2001/136254* (2013.01); *G02F 2001/136263* (2013.01); *G09G 3/3688* (2013.01); *G09G 2300/0426* (2013.01); *G09G 2330/08* (2013.01)

(58) Field of Classification Search
CPC . G09G 3/006; G02F 1/1309; G02F 1/136259; G02F 2001/136263
See application file for complete search history.

(56) References Cited

U.S. PATENT DOCUMENTS

| | | | |
|---|---|---|---|
| 2001/0026345 A1* | 10/2001 | Park | G02F 1/13452 349/149 |
| 2005/0128381 A1* | 6/2005 | Tanose | G02F 1/133512 349/106 |
| 2009/0167976 A1* | 7/2009 | Chung | G02F 1/136259 349/54 |

FOREIGN PATENT DOCUMENTS

| | | |
|---|---|---|
| CN | 101216643 A | 7/2008 |
| CN | 102707501 A | 10/2012 |

* cited by examiner

*Primary Examiner* — Wen-Ying P Chen
(74) *Attorney, Agent, or Firm* — Andrew C. Cheng

(57) ABSTRACT

The present invention discloses an array substrate. The data line repair structure of the array substrate includes repair line, control line and a plurality of switch elements. One end of each data line is connected to shorting bar during shorting bar test stage, and the other end is connected to the repair line through a switch element. The control terminal of switch element is connected to control line, input terminal is connected to one end of repair line and the output terminal is connected to a data line. The other end of the repair line is connected to shorting bar during shorting bar test stage. The present invention further discloses a PSVA liquid crystal display panel and manufacturing method thereof. As such, the present invention can improve PSVA process yield rate.

5 Claims, 8 Drawing Sheets

ARRAY SUBSTRATE, PSAV LIQUID CRYSTAL DISPLAY PANEL AND MANUFACTURING METHOD THEREOF

BACKGROUND OF THE INVENTION

1. Field of the Invention

The present invention relates to the field of liquid crystal displaying techniques, and in particular to an array substrate, PSVA liquid crystal display panel and manufacturing method thereof.

2. The Related Arts

Data line serves as an input channel for data signal of liquid crystal display panel, and is an important element of the liquid crystal display panel as well as has great impact on the display quality of liquid crystal display panel. When the data line is broken, the data signal is unable to pass the data line. Pixel electrodes on the broken line cannot receive normal data signal, and thus form dark line. The dark line affects the display quality of the liquid crystal display panel, and therefore, it is necessary to perform repair on the data lines.

FIG. 1 is a schematic view showing the design of the data line driver and repair line in known liquid crystal display panel (LCD). Before, the module process of the liquid crystal display panel, during each stage (such as, array process and cell process), the required data signal is inputted from shorting bar 1 to data line 3. Shorting bar 1 comprises odd channel 1a and even channel 1b. A part of data line 3 is connected to odd channel 1a, and another part of data line 3 is connected to even channel 1b. The data signal is inputted through odd channel 1a and even channel 1b respectively to corresponding data line 3 to drive data line 3. Binding area 2 is the area for binding data line driver in the subsequent module process. Repair line 4 of data line 3 is connected to binding area 2.

FIG. 2 is a schematic view showing a broken data line of FIG. 1. When data line 31 is broken, laser repair is performed after the liquid crystal display panel is manufactured. The data signal is inputted by data line driver in binding area 2 to repair line 4, and through repair line 4 to broken point 5 so that a dark line becomes a dark point so as to improve display quality of liquid crystal display panel.

The data signal on repair line 4 is supplied by data line driver, and the data line driver is disposed in binding area 2 during the module process of liquid crystal display panel. During the array process and cell process, the data line driver is yet disposed. Therefore, during the array process and cell process, repair line 4 cannot input the data signal. In Polymer-Stabilized Vertical Alignment (PSVA) liquid crystal display panel, the PSVA process of the cell process requires to perform a process of applying voltage and then irradiating, that is, a voltage is applied between the upper substrate and the lower substrate so that the liquid crystal molecules show pretilt angle, and then liquid crystal molecules are irradiated or heated so that monomers of the liquid crystal molecules will condense towards Polyimide (PI) surface to make the liquid crystal molecules show fixed pretilt angle. However, before PSVA process, data line 3a is already broken and the data line driver is yet disposed in binding area 2 for inputting data signal, as such, the voltage cannot be applied to the part after the broken line during applying voltage to make liquid crystal molecules showing pretilt angle, which results in a part of liquid crystal molecules unable to form pretilt angle and weak lines existing after the liquid crystal display panel is manufactured.

As shown in FIG. 3, the common approach to solve the problem is to connect one end of repair line 7 to shorting bar 6, and the other end connected to the lower end of data line 8. When the broken line occurs before PSVA process, the required voltage can be inputted through shorting bar 6 to repair line 7 during PSVA process to apply the voltage through repair line 7 to part 8a after the broken line. As such, the liquid crystal molecules in this part are able to form pretilt angle. However, this type of repair line design make repair line 7 directly connected to data line 8. When voltage signal is inputted by shorting bar 6, the voltages at two ends of data line 8 are the same and unable to perform breakage test.

SUMMARY OF THE INVENTION

The technical issue to be addressed by the present invention is to provide an array substrate, PSVA liquid crystal display panel and manufacturing method thereof, to improve yield rate of PSVA process.

The present invention provides an array substrate of PSVA liquid crystal display panel, which comprises: a plurality of data lines and repair structure of data line; the repair structure of data line comprising at least a repair line, at least a control line and a plurality of switch elements; each switch element comprising a control terminal, an input terminal and an output terminal; the control terminal being electrically connected to the control line, the input terminal being electrically connected to one end of the repair line, the output terminal being electrically connected to a data line, the other end of the repair line being electrically connected to shorting bar for inputting data signal during the shorting bar test stage; one end of each data line being electrically connected to shorting bar during shorting bar test stage for inputting data signal through shorting bar, the other end of each data line being connected to repair line through a switch element; the number of data lines and the number of switch elements being the same; the shorting bar comprising: a first shorting line and a second shorting line, the plurality of data lines comprising: a plurality of first data lines and a plurality of second data lines, one end of each first data line being electrically connected to the first shorting line during shorting bar test stage and the other end being connected to repair line through a switch element; one and of each second data line being electrically connected to second shorting line during shorting bar test stage, the other end being connected to repair line through a switch element; the switch element being a thin film transistor, the thin film transistor comprising a gate terminal acting as the control terminal, a source terminal acting as the input terminal and a drain terminal acting as the output terminal, the gate terminal being electrically connected to the control line, the source terminal being electrically connected to repair line, and the drain terminal being electrically connected to data line; wherein during the breakage test of data line, switch element being controlled as off and test signal being inputted at both ends of the data line, when the data line being broken, switch element being controlled as on during the PSVA process so that the data signal being propagated to the broken part of the data line through repair line.

According to a preferred embodiment of the present invention, the number of repair line and the number of control line are both one; one end of repair line is electrically connected to first shorting line or second shorting line during shorting bar test stage, the other end is electrically connected to all switch elements, the control line is electrically connected to all switch elements to control the switch elements as on or off.

According to a preferred embodiment of the present invention, the number of repair lines and control lines are both two, and one end of one repair line is electrically connected to first shorting line or second shorting line during shorting bar test stage and the other end is electrically connected to the switch element corresponding to first data line; one end of the other repair line is electrically connected to first shorting line or second shorting line and the other end is electrically connected to the switch element corresponding to second data line; one control line is electrically connected to the switch element corresponding to first data line to control the corresponding switch element as on or off; and the other control line is electrically connected to the switch element corresponding to second data line to control the corresponding switch element as on or off.

The present invention provides a PSVA liquid crystal display panel, which comprises: an array substrate and a source driver chip for inputting data signal; the array substrate comprising: a plurality of data lines and repair structure of data line; the repair structure of data line comprising at least a repair line, at least a control line and a plurality of switch elements; each switch element comprising a control terminal, an input terminal and an output terminal; the control terminal being electrically connected to the control line, the input terminal being electrically connected to one end of the repair line, the output terminal being electrically connected to a data line; during module process of liquid crystal display panel, source driver chip being disposed so that the other end of the repair line being electrically connected to source driver chip; one end of each data line being electrically connected to source driver chip, the other end of each data line being connected to repair line through a switch element; wherein before module process of liquid crystal display panel, one end of the repair line being electrically connected to a switch element, the other end of the repair line being electrically connected to shorting bar for inputting data signal during the shorting bar test stage; one end of each data line being electrically connected to shorting bar during shorting bar test stage for inputting data signal through shorting bar, the other end of each data line being connected to repair line through a switch element; during the breakage test of data line, switch element being controlled as off and test signal being inputted at both ends of the data line, when the data line being broken, switch element being controlled as on during the PSVA process so that the data signal being propagated to the broken part of the data line through repair line.

According to a preferred embodiment of the present invention, the number of data lines and the number of switch elements are the same; the shorting bar comprises: a first shorting line and a second shorting line, the plurality of data lines comprises: a plurality of first data lines and a plurality of second data lines, one end of each first data line being electrically connected to the first shorting line during shorting bar test stage and the other end being connected to repair line through a switch element; one end of each second data line being electrically connected to second shorting line during shorting bar test stage, the other end being connected to repair line through a switch element.

According to a preferred embodiment of the present invention, the number of repair line and the number of control line are both one; one end of repair line is electrically connected to first shorting line or second shorting line during shorting bar test stage, the other end is electrically connected to all switch elements, the control line is electrically connected to all switch elements to control the switch elements as on or off.

According to a preferred embodiment of the present invention, the number of repair lines and control lines are both two, and one end of one repair line is electrically connected to first shorting line or second shorting line during shorting bar test stage and the other end is electrically connected to the switch element corresponding to first data line; one end of the other repair line is electrically connected to first shorting line or second shorting line and the other end is electrically connected to the switch element corresponding to second data line; one control line is electrically connected to the switch element corresponding to first data line to control the corresponding switch element as on or off; and the other control line is electrically connected to the switch element corresponding to second data line to control the corresponding switch element as on or off.

According to a preferred embodiment of the present invention, the switch element is a thin film transistor, and the thin film transistor comprises a gate terminal acting as the control terminal, a source terminal acting as the input terminal and a drain terminal acting as the output terminal, the gate terminal being electrically connected to the control line, the source terminal being electrically connected to repair line, and the drain terminal being electrically connected to data line.

The present invention provides a manufacturing method of PSVA liquid crystal display panel, which comprises the steps of manufacturing array substrate and color substrate respectively, wherein the array substrate comprising a plurality of data lines and data line repair structure, the data line repair structure comprising at least a repair line, at least a control line and a plurality of switch elements, each switch element comprising a control terminal, an input terminal and an output terminal; the control terminal being electrically connected to the control line, the input terminal being electrically connected to one end of the repair line, the output terminal being electrically connected to a data line, the other end of the repair line being electrically connected to shorting bar for inputting data signal during the shorting bar test stage; one end of each data line being electrically connected to shorting bar during shorting bar test stage for inputting data signal through shorting bar, the other end of each data line being connected to repair line through a switch element; assembling array substrate and color filter substrate to form assembly panel, wherein a liquid crystal layer being sandwiched between the array substrate and the color filter substrate; inputting voltage signals to the array substrate and the color filter substrate of assembly panel to make liquid crystal molecules of the liquid crystal layer sandwiched between the array substrate and the color filter substrate forming pretilt angle; performing UV irradiation or heating to assembly panel to fix the layout of the liquid crystal molecules so that liquid crystal molecules having fixed pretilt angle; cutting assembly panel and performing module assembly to form liquid crystal display panel; wherein before inputting voltage signals to the array substrate and the color filter substrate of assembly panel, further comprising a step of: inputting control signal to control line of array substrate to turn on the switch element so that the voltage signals able to reach data line through switch element.

According to a preferred embodiment of the present invention, the number of data lines and the number of switch elements are the same; the shorting bar comprises: a first shorting line and a second shorting line, the plurality of data lines comprises: a plurality of first data lines and a plurality of second data lines, one end of each first data line being electrically connected to the first shorting line during shorting bar test stage and the other end being connected to repair line through a switch element; one end of each second data line being electrically connected to second shorting line during shorting bar test stage, the other end being connected to repair line through a switch element.

According to a preferred embodiment of the present invention, the number of repair line and the number of control line are both one; one end of repair line is electrically connected to first shorting line or second shorting line during shorting bar test stage, the other end is electrically connected to all switch elements, the control line is electrically connected to all switch elements to control the switch elements as on or off.

According to a preferred embodiment of the present invention, the number of repair lines and control lines are both two, and one end of one repair line is electrically connected to first shorting line or second shorting line during shorting bar test stage and the other end is electrically connected to the switch element corresponding to first data line; one end of the other repair line is electrically connected to first shorting line or second shorting line and the other end is electrically connected to the switch element corresponding to second data line; one control line is electrically connected to the switch element corresponding to first data line to control the corresponding switch element as on or off; and the other control line is electrically connected to the switch element corresponding to second data line to control the corresponding switch element as on or off.

According to a preferred embodiment of the present invention, the switch element is a thin film transistor, and the thin film transistor comprises a gate terminal acting as the control terminal, a source terminal acting as the input terminal and a drain terminal acting as the output terminal, the gate terminal being electrically connected to the control line, the source terminal being electrically connected to repair line, and the drain terminal being electrically connected to data line.

The efficacy of the present invention is that to be distinguished from the state of the art. In the array substrate of the present invention, one end of each data line is electrically connected to shorting bar during shorting bar test stage for inputting data signal through shorting bar, the other end of each data line is connected to repair line through a switch element; the control line is electrically connected to the control terminal for switch element for controlling the switch element as on or off, the input terminal of the switch element is electrically connected to one end of the repair line and the output terminal is connected to a data line so that the repair line and the data line are electrically connected when the switch element is on, the other end of the repair line is electrically connected to shorting bar during shorting bar test stage; when the data line is broken before the PSVA process, the control line inputs control signal to turn on the switch element during the PSVA process, as such, the data signal can propagate to the data line after the broken point through the repair line to effectively apply data signal to the broken data line so that the liquid crystal molecules at the broken line can form fixed pretilt angle during UV irradiation to ensure the PSVA process and improve yield rate. Furthermore, turning off the switch element makes the data line and the repair line disconnected. When the data line is broken, the signals at two ends of the data line are not consistent because the data line and the repair line are not connected. Therefore, through inputting test signal at two ends of the data line, the broken data line can be detected.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following description refers to drawings and embodiments of the present invention in details.

Figure 1:
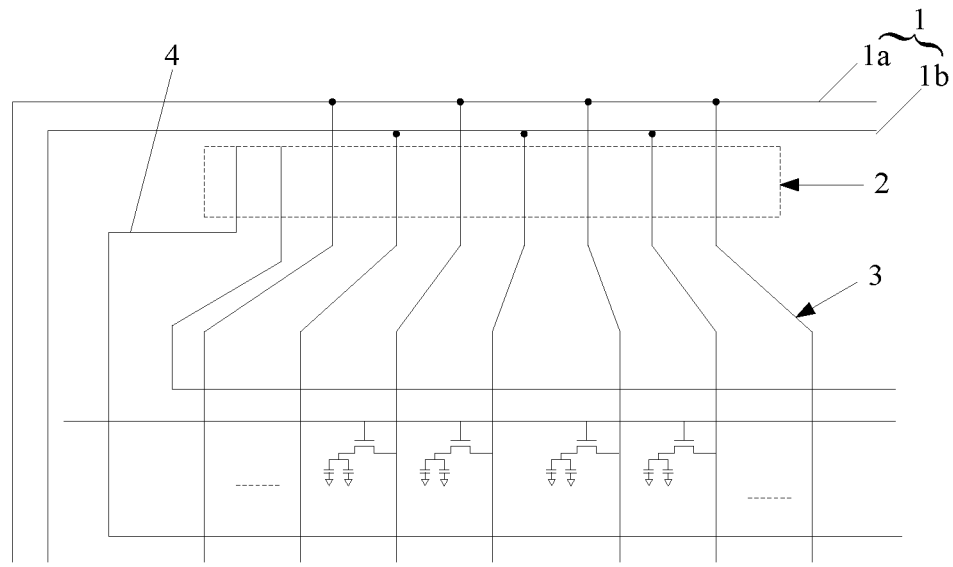
FIG. 1 is a schematic view showing the structure of data line driver and repair line design before the module process of a known liquid crystal display device.
Figure 2:
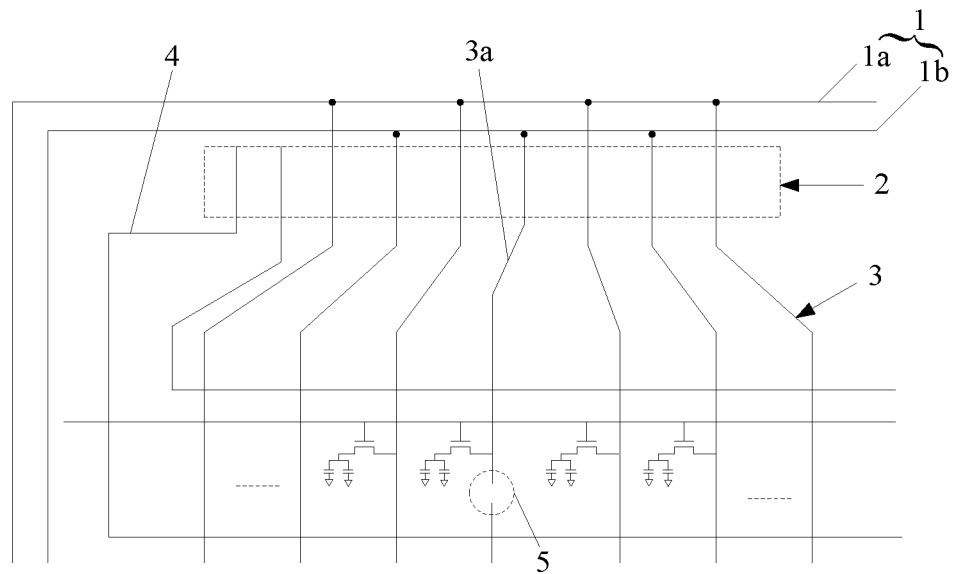
FIG. 2 is a schematic view showing the structure of a broken data line shown in FIG. 1.
Figure 3:
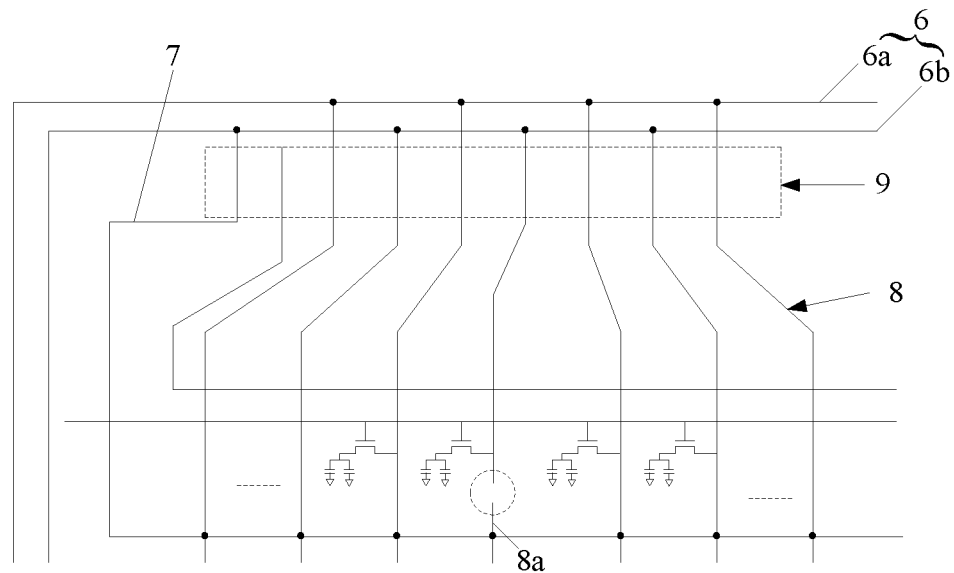
FIG. 3 is a schematic view showing the structure of the repair line of a known data line.
Figure 4:
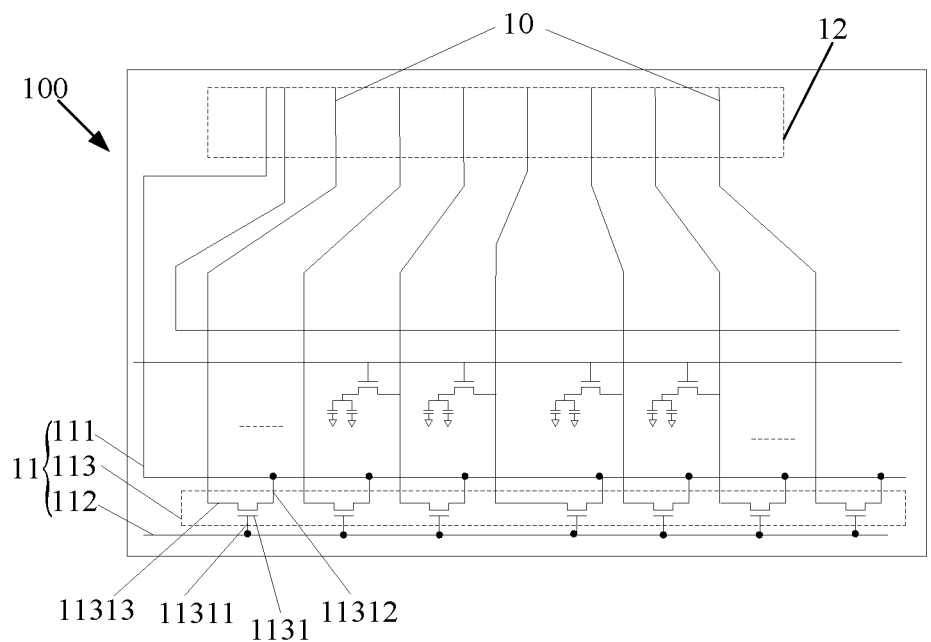
FIG. 4 is a schematic view showing the structure of an embodiment of array substrate of PSVA liquid crystal display panel according to the present invention.

Referring to FIG. 4, FIG. 4 is a schematic view showing the structure of an embodiment of array substrate of PSVA liquid crystal display panel according to the present invention. As shown in FIG. 4, an array substrate 100 comprises a plurality of a plurality of data lines 10 and repair structure 11 of data line. The data lines 10 are for applying data signals to the array substrate 100, and the data line repair structure 11 is for performing repair to broken data lines during PSVA process.

The data line repair structure 11 comprises a repair line 111, at a control line 112 and a switch assembly 113. The switch assembly 113 comprises a plurality of switch elements 1131. Each switch element 1131 comprises a control terminal 11311, an input terminal 11312 and an output terminal 11313. The control terminal 11311 of each switch element 1131 is electrically connected to the control line 112, the input terminal 11312 is electrically connected to one end of the repair line 111, and the output terminal 11313 is electrically connected to a data line 10. The other end of the repair line 111 is electrically connected to shorting bar for inputting data signal during the shorting bar test stage. The shorting bar is to propagate the test data signal to repair line 111. In the instant embodiment, the shorting bar test stage is the stage during the liquid crystal display panel manufacturing process before the shorting bar for inputting data signal is cut off; that is, the stage before cutting the panel. One end of each data line 10 is electrically connected to shorting bar during shorting bar test stage for inputting data signal through shorting bar, the other end of each data line 10 is connected to repair line 111 through a switch element 1131. The number of data lines 10 and the number of switch elements 1131 are the same. One data line 10 corresponds to one switch element 1131 to connect to repair line 111 through switch element 1131.

In the instant embodiment, the switch element 1131 is a thin film transistor, and the thin film transistor comprises a gate terminal acting as the control terminal, a source terminal acting as the input terminal and a drain terminal acting as the output terminal. The gate terminal is electrically connected to the control line 112, the source terminal is electrically connected to repair line 111, and the drain terminal is electrically connected to data line 10. The switch element 1131 can also be realized by other types of three-terminal control switch and thus no specific restriction is imposed here.

Figure 5:
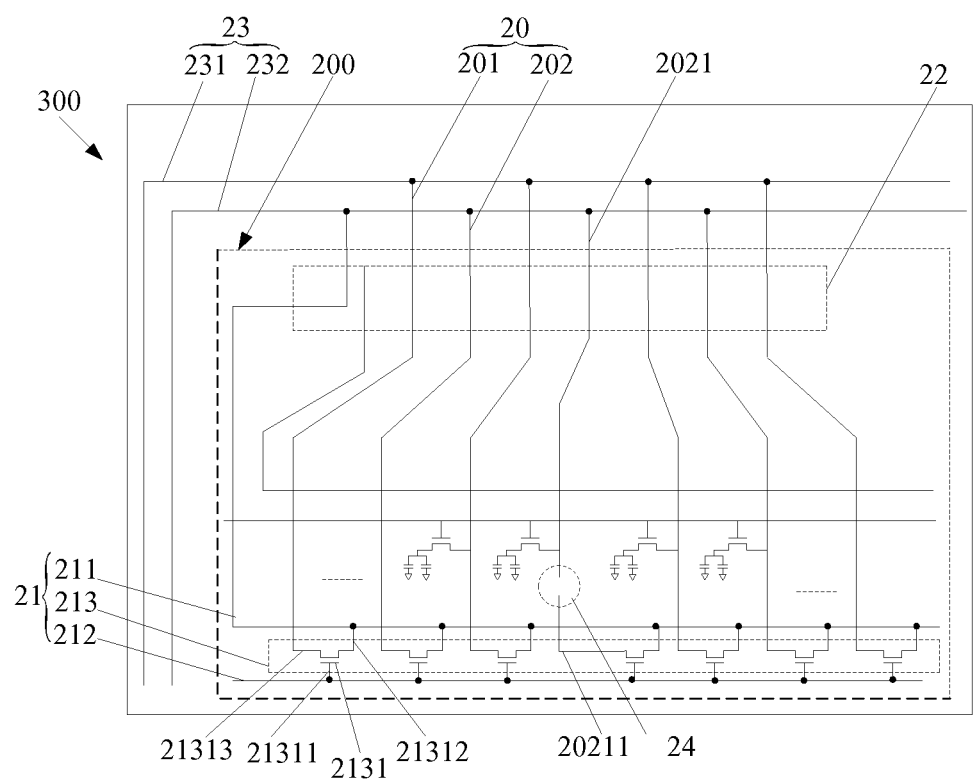
FIG. 5 is a schematic view showing the structure of an embodiment of array substrate of FIG. 4 as a part of a large glass substrate, with a broken data line marked in the array substrate.

For convenient description of the repair operation of data line repair structure 11, the following refers to FIG. 5. FIG. 5 is a schematic view showing the structure of an embodiment of array substrate of FIG. 4 as a part of a large glass substrate, with a broken data line marked in the array substrate. The manufacturing process of liquid crystal display panel mainly comprises array process, cell process and module process. The shorting bar test stage is concerned with array process and the cell process. The array process is the process to manufacture array substrate 200, with large glass substrate 300 as a main material for manufacturing array substrate 200. Main components of array substrate 200, such as, data line 20, are all formed on large glass substrate 300. During manufacturing array substrate 200, source driver chip (COF) is yet installed to array substrate 200. Instead, only binding area 22 for binding source driver chip is disposed on array substrate 200 so that in the subsequent module process the source driver chip can be installed in binding area 22 so as to drive data line 20 through source driver chip. However, during manufacturing array substrate 200, it is necessary to input data signal to data line 20 for test to ensure data line 20 can function normally. Therefore, shorting bar 23 is disposed on large glass substrate 300 for test to replace source driver chip to input data signal to data line 20 to drive data line to work. In subsequent module process, shorting bar 23 is cut off. After cutting off, the shorting bar test stage is finished. Shorting bar 23 is required for inputting data signal during shorting bar test stage.

The data lines 20 comprise a plurality of first data lines 201 and a plurality of second data lines 202 for dividing the data signals into a set of odd signals and a set of even signals for inputting to array substrate 200. As the resolution of the liquid crystal display increases, the data transmission rate becomes higher. To relieve the demands on the driver chip and the transmission bandwidth because of the resolution and reduce the electromagnetic interference, the data signals are divided into odd signals and even signals for transmission through first data lines 201 and second data lines 202. In correspondence to odd signals and even signals, the shorting bar 23 of large glass substrate 300 also comprises a first shorting line 231 and a second shorting line 232, wherein the first shorting line is odd channel for inputting add signals and the second shorting line 232 is even channel for inputting even signals. In the instant embodiment, the odd signal and the even signal are the same data signal. One end of each first data line 201 is electrically connected to the first shorting line 231 during shorting bar test stage for inputting odd signal through first shorting line 231 and the other end is connected to repair line 211 through a switch element 2131. One end of each second data line 202 is electrically connected to second shorting line 202 during shorting bar test stage for inputting even signal through second shorting line 232, and the other end being connected to repair line 211 through a switch element 2131.

In the instant embodiment, the number of repair line 211 and the number of control line 212 are both one. One end of repair line 211 is electrically connected to first shorting line 232 or second shorting line during shorting bar test stage for inputting signal through second shorting line 232. The other end is electrically connected to input terminals 21312 of all switch elements 2131. The control line 212 is electrically connected to the control terminal 21311 of all switch elements 2131 to control the switch elements 2131 as on or off. The output terminal 21313 of a part of switch elements is electrically connected to first data line 201, and the output terminal 21313 of a part of switch elements is electrically connected to second data line 202.

When using array substrate 200 of the instant embodiment to form PSVA liquid crystal display panel, during the cell process of attaching arrays substrate 200 to the color filter substrate to form module panel, the large glass substrate 300 is yet cut. Instead, the large glass substrate 300 is attached to the substrate forming color filter substrate so that the array substrate 200 is attached to the color filter substrate correspondingly to form module panel. A liquid crystal layer in sandwiched in the module panel. After forming module panel, the PSVA process of the cell process is performed to align the liquid crystal molecules of the liquid crystal layer. In the PSVA process, the voltage signal is applied through array substrate 200 and color filter substrate and UV irradiation is performed on the liquid crystal molecules no that the liquid crystal molecules form fixed pretilt angle. The voltage signal to array substrate 200 is inputted through shorting bar 23 to data line 20. The voltage signal is inputted to array substrate 200 through data line 20.

During the shorting bar test stage, before the PSVA process, a data line 2021 of the data lines 20 is already broken. During the PSVA process, the repair structure 21 of the instant embodiment can repair the broken data line 2021. Specifically, in PSVA process, when voltage signal needs to be applied to array substrate 200, odd signals and even signals are inputted to first shorting line 231 and second shorting line 232 of shorting bar 23, and the odd signals and even signals are the voltage signals required by the array substrate 200 and are the same signals. The odd signals and the even signals propagate through the first data line 201 and the second data line 202 respectively to array substrate 200. The control single is inputted to control line 212 for turning on all switch elements 2131 of the switch assembly 213. At this point, the repair line 211 propagates the even signal through a switch element 2131 to a data line 20 (either first data line 201 or second data line 202) so that each data line 20 has voltage signal inputted at the end away from the shorting bar 23. As such, the part of data line 20211 after the broken point 24 can also receive voltage signal input to make liquid crystal molecules corresponding to this part of data line 20211 form pretilt angle to ensure the success of PSVA process.

In addition, the data line repair structure 21 of the instant embodiment can also be used to perform breakage test on data line 20. Specifically, to perform the test, the control signal is not inputted to the control line 212, and all switch elements 2131 are turned off. As such, voltage signal of shorting bar 23 cannot propagate through repair line 211 to data line 20. If a data line, such as data line 2021, is broken, the signals at two ends of the data line 2021 will be different. That is, the part of data line 2021 after the broken point 24 will not have voltage signal input. When test signals are inputted at the two ends of data line 2021, the test signals will generate different feedback signals. The feedback signals can be used to determine whether the data line 2021 is broken.

As such, in the instant embodiment, if a data line 2021 is broken before the PSVA process, the broken data line 2021 can be repaired through data line repair structure 21 during the PSVA process to ensure the success of the PSVA process and improve the yield rate. In addition, the test of breakage in data line 20 can also be performed through data line repair structure 21 to further improve yield rate.

Figure 6:
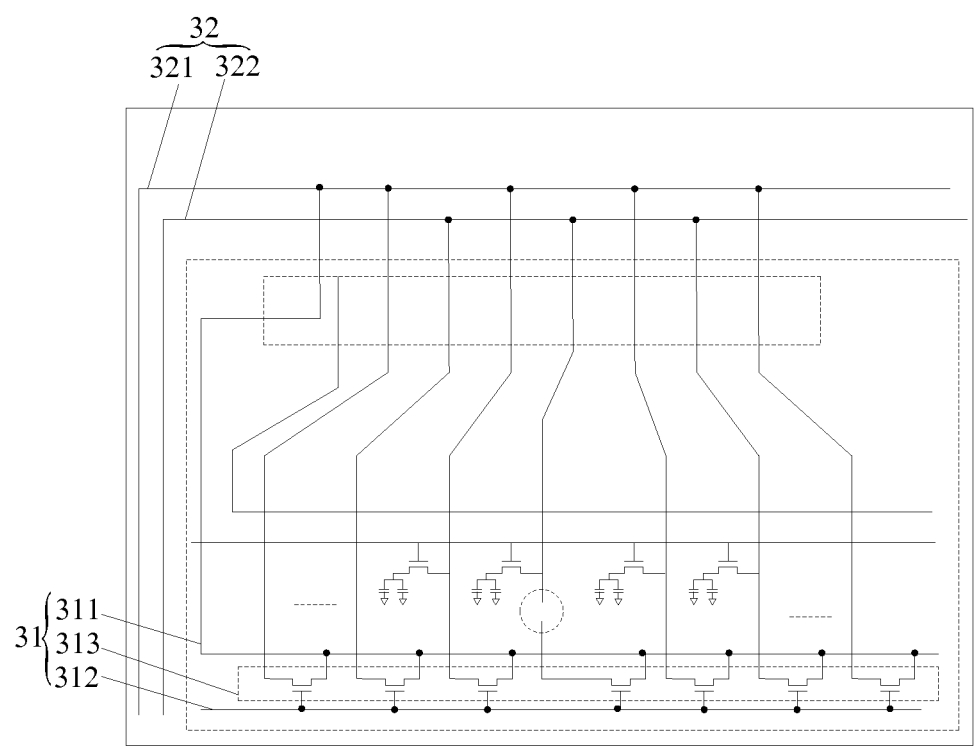
FIG. 6 is a schematic view showing the structure of another embodiment of array substrate of FIG. 4 as a part of a large glass substrate, with a broken data line marked in the array substrate.

It should be noted that, in FIG. 6, because the odd signal and even signal inputted by first shorting line 321 and second shorting line 322 of shorting bar 32 respectively are the same, repair line 311 can also be electrically connected to first shorting line 321 during the shorting bar test stage so as to input corresponding signal through first shorting line 321 to achieve the repair. The specific circuit connection and repair operation can refer to the above embodiment and will not be repeated here.

Figure 7:
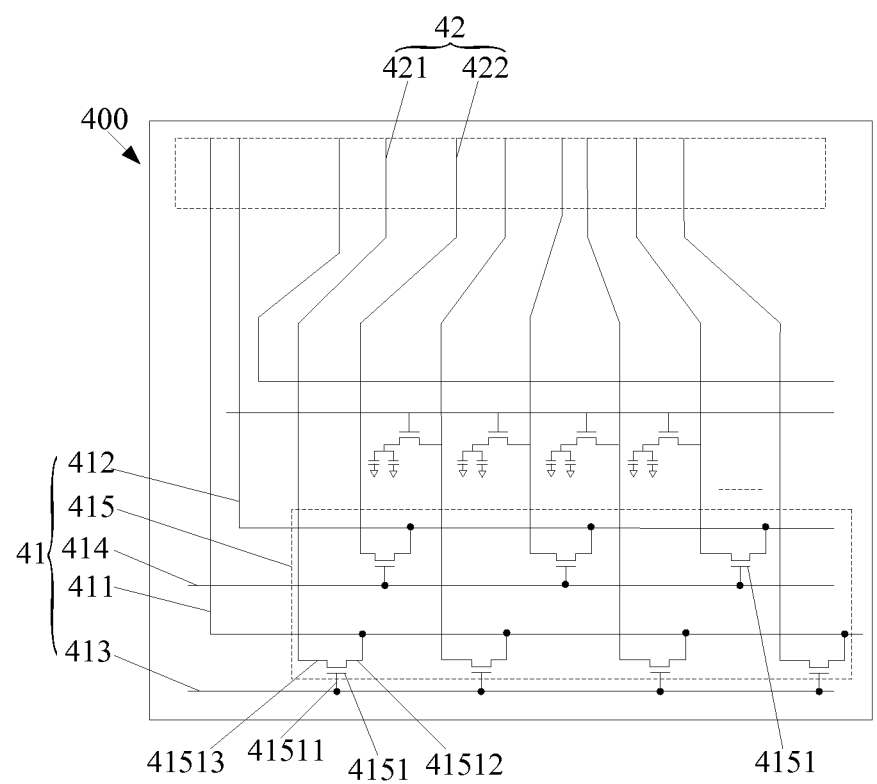
FIG. 7 is a schematic view showing the structure of another embodiment of array substrate of PSVA liquid crystal display panel according to the present invention.

In the above embodiment, the number of the repair line and the number of the control line of the array substrate are both one. Refer to FIG. 7. The difference from the above embodiment is that there are two repair lines and two control lines in the present embodiment. Specifically, the data line repair structure 41 of array substrate 400 comprises a first repair line 411, a second repair line 412, a first control line 413, a second control line 414 and a switch assembly 415, wherein the switch assembly 415 comprises a plurality of switch elements 4151. The plurality of data line 42 comprises a plurality of first data lines 421 and a plurality of second data lines 422. Each first data line 421 and data line 422 correspond to a switch element 4151 respectively, wherein, for all switch elements 4151 corresponding to first data lines 421, the input terminal 41512 is electrically connected to one end of the first repair line 411, and the control terminals 41511 is electrically connected to the first control line 413 for controlling the on or off the corresponding switch element 4151. The output terminal 41513 of switch element 4151 is connected respectively to a first data line 421. The other end of the first repair line 411 is electrically connected to shorting bar (not shown) for inputting data signal during shorting bar test stage. Similarly, for all switch elements 4151 corresponding to second data lines 422, the input terminal 41512 is electrically connected to one end of the second repair line 412, and the control terminals 41511 is electrically connected to the second control line 414 for controlling the on or off the corresponding switch element 4151. The output terminal 41513 of switch element 4151 is connected respectively to a second data line 422. The other end of the second repair line 412 is electrically connected to shorting bar during shorting bar test stage.

Figure 8:
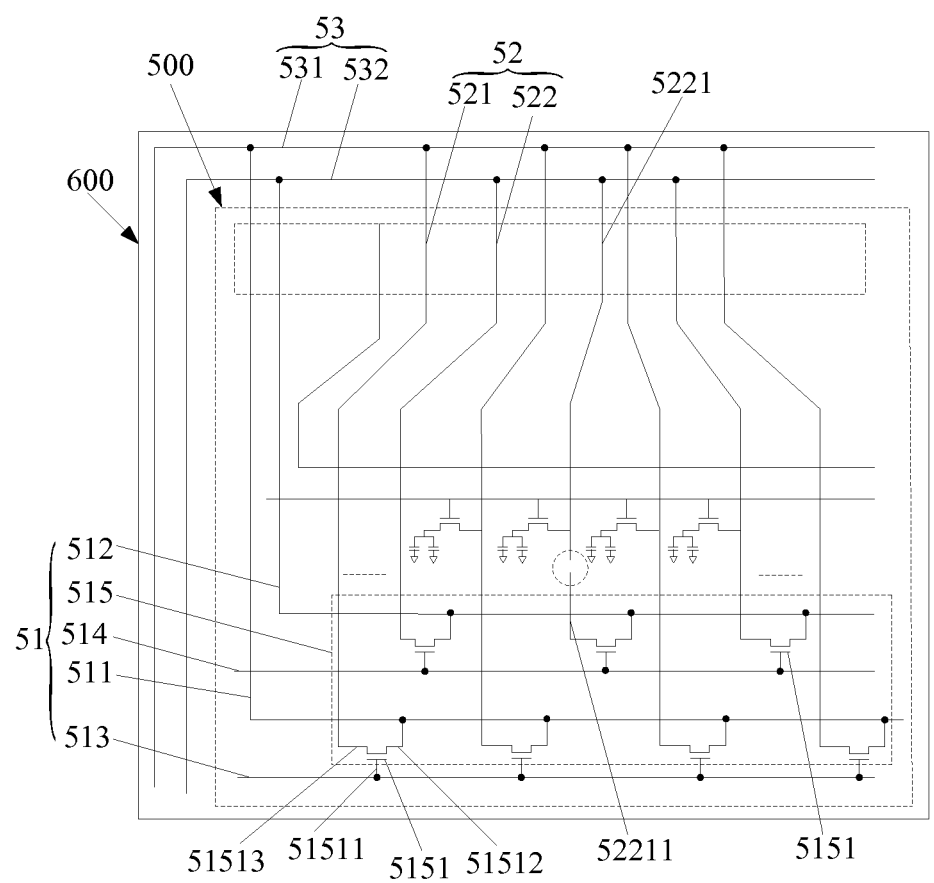
FIG. 8 is a schematic view showing the structure of an embodiment of array substrate of FIG. 7 as a part of a large glass substrate, with a broken data line marked in the array substrate.

With the data line repair structure 41 of the present embodiment, if a data line 42 broken before PSVA process can also be repaired during the PSVA process. Specifically, referring to FIG. 8, FIG. 8 is a schematic view showing the structure of an embodiment of array substrate of FIG. 7 as a part of a large glass substrate, with a broken data line marked in the array substrate. In the instant embodiment, first repair line 511 is electrically connected to first shorting line 531 of shorting bar 53 during the shorting bar test stage, and second repair line 512 is electrically connected to second shorting line 532 of shorting bar 53 during the shorting bar test stage. During the shorting bar test stage, when a data line 52, such as data line 5221, is broken before PSVA process, if it is uncertain whether first data line 521 or second data line 522 during the PSVA process, the control signals can be inputted to first control line 513 and second control line 514 to turn on corresponding switch element 5151. On the other hand, if it can be certain whether first data line 521 or second data line 522 during the PSVA process, the control signal can be only inputted to the corresponding switch element 5151 to turn on the switch element 5151. After switch element 5151 is turned on, the voltage signal required by the PSVA process is propagated respectively through first shorting line 531 and second shorting line 532 to first repair line 521 and second repair line 532. The voltage signal is inputted to the far end of first data line 521 and second data line 522 away from shorting bar 53 through corresponding switch element 5151 so that the part data line 52211 of broken data line 5221 also has input voltage signal to ensure the success of PSVA process and improve yield rate. In addition, the test of breakage in data line 52 can also be performed through controlling switch element 5151 as on or off to further improve yield rate.

It should be noted that, in the instant embodiment, first repair line 511 can also be electrically connected to second shorting line 532, and the second repair line 512 can also be electrically connected to first shorting line 531. No specific restriction is imposed here.

Figure 9:
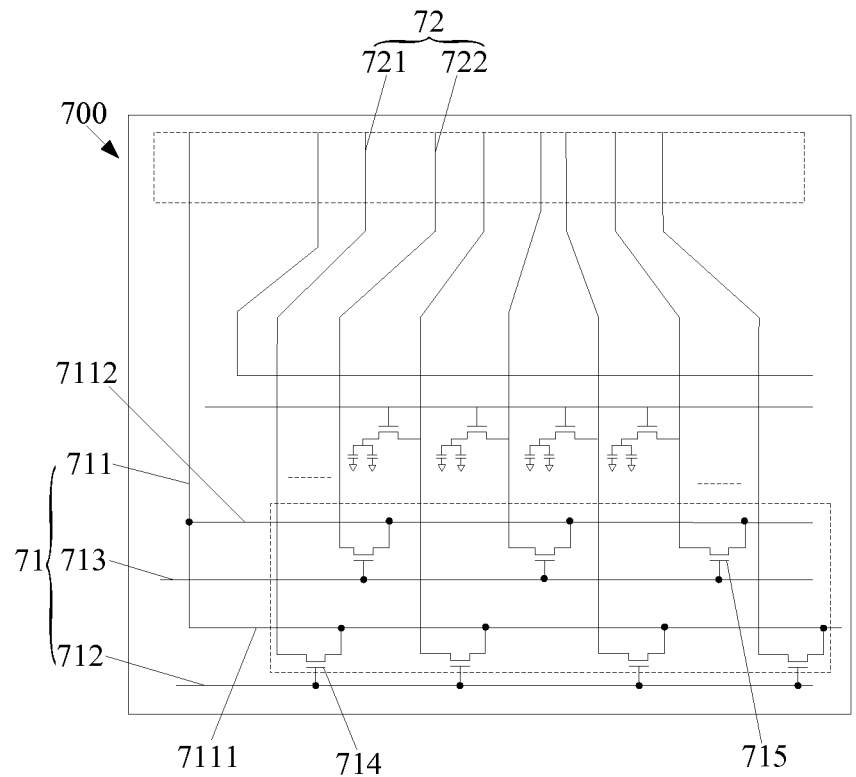
FIG. 9 is a schematic view showing the structure of yet another embodiment of array substrate of PSVA liquid crystal display panel according to the present invention.

Furthermore, referring to FIG. 9, in another embodiment of the array substrate of the present invention, the number of repair line 711 is one, but the repair line comprises two branches, that is, first branch 7111 and second branch 7112. The number of control lines is two, that is, first control line 712 and second control line 713 respectively. Each first data line 721 is connected through a first switch element 714 to the first branch 7111 of repair line 711, and each second data line 722 is connected through a second switch element 715 to the second branch 7112 of repair line 711. The first control line 712 controls the first switch element 714 corresponding to first data line 721 as on or off, and the second control line 713 controls the second switch element 715 corresponding to second data line 722 as on or off.

Through the control of first control line 712 and second control line 713, repair line 711 can repair the first data line 721 and second data line 722 respectively. The specific repair operation can refer to the above embodiment and will not be repeated here.

Obviously, the numbers of repair line and the control lines of the array substrate of the present invention are not restricted to any specific number as long as each data line is connected to a repair line through a switch element. The repair and the breakage test can be performed through turning the switch element on or off.

Figure 10:
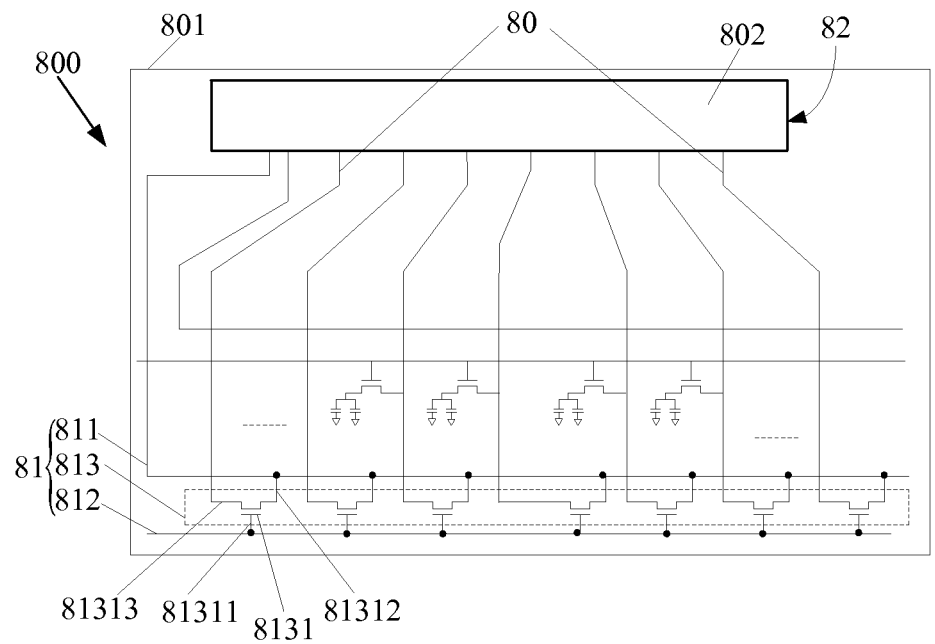
FIG. 10 is a schematic view showing the structure of an embodiment of a PSVA liquid crystal display panel according to the present invention.

The present invention further provides an embodiment of PSVA liquid crystal display panel. A liquid crystal display panel 800 comprises: an array substrate 801 and a source driver chip 802 for inputting data signal, wherein the array substrate 801 is any substrate of any embodiment described earlier. Take the array embodiment in FIG. 4 as example for the following description Refer to FIG. 10. Array substrate 801 comprises a plurality of data lines 80 and data line repair structure 81, wherein the data line repair structure 81 comprises a repair line 811, a control line 812 and a switch assembly 813.

Specifically, switch assembly 813 comprises a plurality of switch elements 8131, and each switch element 8131 comprises a control terminal 81311, an input terminal 80312 and an output terminal 81313. The control terminal 81311 is electrically connected to the control line 812 for control line 812 to control the switch element 8131 as on or off, the input terminal 81312 is electrically connected to one end of the repair line 811, and the output terminal 81313 is electrically connected to a data line 10. During module process of liquid crystal display panel, source driver chip 82 is disposed in binding area 82 of array substrate 801 so that the other end of the repair line 811 is electrically connected to source driver chip 802. One end of each data line 80 is electrically connected to source driver chip 802 for the source driver chip 802 to input data signal, the other end of each data line 80 is connected to repair line 811 through a switch element 8131.

In the instant embodiment, before module process of liquid crystal display panel, test is performed on data line 80. During the shorting bar test stage, the shorting bar can be used to input data signal to data line for testing. Therefore, before disposing source driver chip 802, one end of the repair line is electrically connected to a switch element 8131, and the other end of the repair line is electrically connected to shorting bar for inputting data signal. One end of each data line 80 is electrically connected to shorting bar during shorting bar test stage, and the other end of each data line 80 is connected to repair line 811 through a switch element 8131.

During the breakage test of data line, no control signal is inputted by control line 812 and switch element 8131 is controlled as off. The test signal is inputted at both ends of the data line 80. Because the repair line 811 and data line 80 are not connected, when the data line 80 is broken, the data signals at two ends of data line 80 are not consistent. That is, the part after broken point has no data signal. Therefore, the feedback signal can be used to determine whether the data line is broken. When the data line 80 is broken before the PSVA process, during the PSVA process, the shorting bar inputs data signal to repair line 811 and one end of data line 80 to control switch element 8131 as on so that the data signal on repair line 811 can be propagated through switch element 8131 to the other end of data line 80 so that both ends of the data line have data signal input to accomplish repair of the broken data line.

Liquid crystal display panel 800 of the present embodiment, through disposition of data line repair structure 81 in array substrate 801, can perform repair to broken data line during PSVA process to ensure the success of PSVA process and perform breakage test on data line 80 to improve yield rate.

Figure 11:
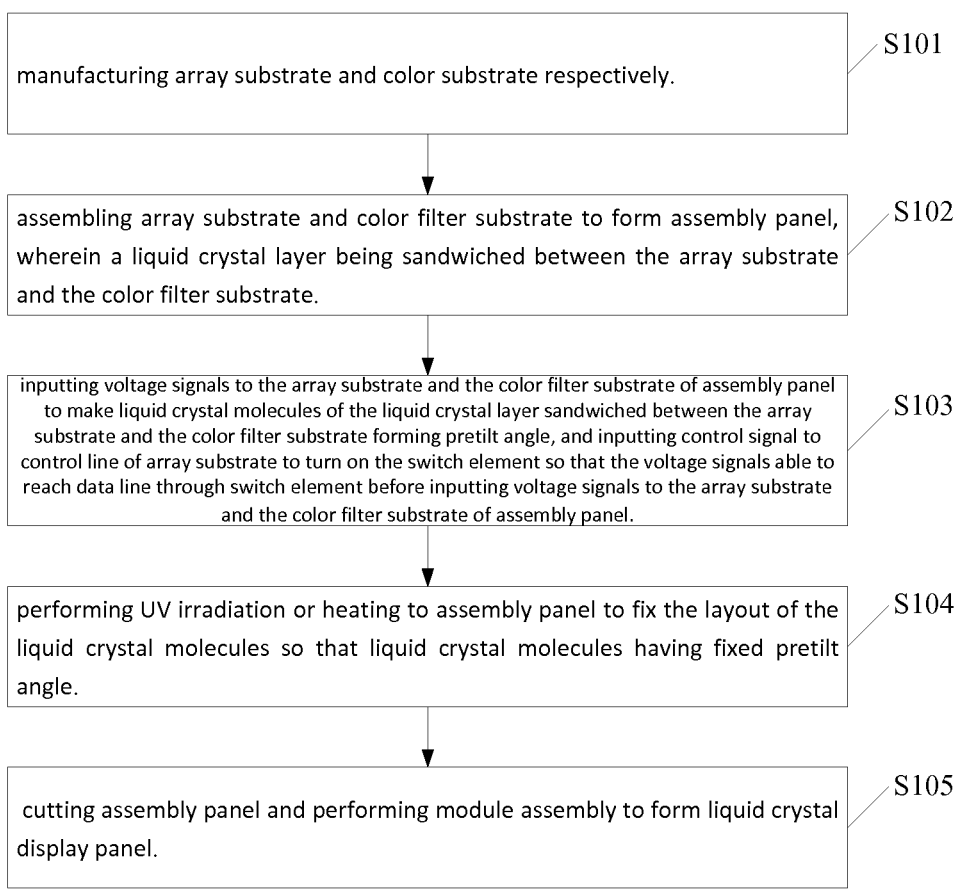
FIG. 11 is a flowchart of an embodiment of the manufacturing method of a PSVA liquid crystal display panel according to the present invention.

Referring to FIG. 11, the present invention further provides a manufacturing method of PSVA liquid crystal display panel, which the following steps.

Step S101: manufacturing array substrate and color substrate respectively, wherein the array substrate being any array substrate of above embodiments, and comprising a plurality of data lines and data line repair structure, the data line repair structure comprising at least a repair line, at least a control line and a plurality of switch elements, each switch element comprising a control terminal, an input terminal and an output terminal; the control terminal being electrically connected to the control line, the input terminal being electrically connected to one end of the repair one, the output terminal being electrically connected to a data line, the other end of the repair line being electrically connected to shorting bar for inputting data signal during the shorting bar test stage; one end of each data line being electrically connected to shorting bar during shorting bar test stage for inputting data signal through shorting bar, the other end of each data line being connected to repair line through a switch element.

Step S102: assembling array substrate and color filter substrate to form assembly panel, wherein a liquid crystal layer being sandwiched between the array substrate and the color filter substrate.

Step S103: inputting voltage signals to the array substrate and the color filter substrate of assembly panel to make liquid crystal molecules of the liquid crystal layer sandwiched between the array substrate and the color filter substrate forming pretilt angle, and inputting control signal to control line of array substrate to turn on the switch element so that the voltage signals able to reach data line through switch element before inputting voltage signals to the array substrate and the color filter substrate of assembly panel.

After forming module panel, when entering PSVA process, the voltage signal is inputted to array substrate and the color filter substrate respectively so that the liquid crystal molecules in the module panel can form a specific layout with pretilt angle. The voltage signal required by the array substrate is inputted through shorting bar to the data line, and through data line to the array substrate. Before inputting voltage signal to the array substrate, the switch element of the data line repair structure in array substrate is turned on so that the voltage signal can be propagated through repair line and switch element to corresponding data line. Therefore, the voltage signal can be applied to the data line broken before PSVA process to effectively repair the broken data line during PSVA process to ensure the success of PSVA process.

In addition, in the above steps, when breakage test is performed on data line of array substrate, the switch element can be controlled as off so that the repair line and the data line are not connected to test the breakage of the data line.

Step S104: performing UV irradiation or heating to assembly panel to fix the layout of the liquid crystal molecules so that liquid crystal molecules having fixed pretilt angle.

Step S105: cutting assembly panel and performing module assembly to form liquid crystal display panel.

After the cell process, the shorting bar is cut off for the subsequent module process to perform disposition of circuit board and source driver chip to accomplish the manufacturing of liquid crystal display panel.

In the present embodiment, the repair line of the array substrate is connected to data line through switch element. Each data line corresponds to a switch element. Through controlling the switch element to control the connection of repair line and data line, the breakage test and the broken line repair can be realized to ensure the success of PSVA process and improve yield rate.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of PSVA liquid crystal display panel, which comprises the steps of:

manufacturing array substrate and color substrate respectively, wherein the array substrate comprising a plurality of data lines and data line repair structure, the data line repair structure comprising at least a repair line, at least a control line and a plurality of switch elements, each switch element comprising a control terminal, an input terminal and an output terminal; the control terminal being electrically connected to the control line, the input terminal being electrically connected to one end of the repair line, the output terminal being electrically connected to a data line, the other end of the repair line being electrically connected to shorting bar for inputting data signal during the shorting bar test stage; one end of each data line being electrically connected to shorting bar during shorting bar test stage for inputting data signal through shorting bar, the other end of each data line being connected to repair line through a switch element;

assembling array substrate and color filter substrate to form assembly panel, wherein a liquid crystal layer being sandwiched between the array substrate and the color filter substrate;

inputting voltage signals to the array substrate and the color filter substrate of assembly panel to make liquid crystal molecules of the liquid crystal layer sandwiched between the array substrate and the color filter substrate forming pretilt angle;

performing UV irradiation or heating to assembly panel to fix the layout of the liquid crystal molecules so that liquid crystal molecules having fixed pretilt angle;

cutting assembly panel and performing module assembly to form liquid crystal display panel;

wherein before inputting voltage signals to the array substrate and the color filter substrate of assembly panel, further comprising a step of: inputting control signal to control line of array substrate to turn on the switch element so that the voltage signals able to reach data line through switch element.

2. The manufacturing method as claimed in claim 1, characterized in that:

the number of data lines and the number of switch elements are the same; the shorting bar comprises: a first shorting line and a second shorting line, the plurality of data lines comprises: a plurality of first data lines and a plurality of second data lines, one end of each first data line being electrically connected to the first shorting line during shorting bar test stage and the other end being connected to repair line through a switch element; one end of each second data line being electrically connected to second shorting line during shorting bar test stage, the other end being connected to repair line through a switch element.

3. The manufacturing method as claimed in claim 2, characterized in that:

the number of repair line and the number of control line are both one; one end of repair line is electrically connected to first shorting line or second shorting line during shorting bar test stage, the other end is electrically connected to all switch elements, the control line is electrically connected to all switch elements to control the switch elements as on or off.

4. The manufacturing method as claimed in claim 2, characterized in that:

the number of repair lines and control lines are both two, and one end of one repair line is electrically connected to first shorting line or second shorting line during shorting bar test stage and the other end is electrically connected to the switch element corresponding to first data line; one end of the other repair line is electrically connected to first shorting line or second shorting line and the other end is electrically connected to the switch element corresponding to second data line; one control line is electrically connected to the switch element corresponding to first data line to control the corresponding switch element as on or off; and the other control line is electrically connected to the switch element corresponding to second data line to control the corresponding switch element as on or off.

5. The manufacturing method as claimed in claim 1, characterized in that: the switch element is a thin film transistor, and the thin film transistor comprises a gate terminal acting as the control terminal, a source terminal acting as the input terminal and a drain terminal acting as the output terminal, the gate terminal being electrically connected to the control line, the source terminal being electrically connected to repair line, and the drain terminal being electrically connected to data line.

* * * * *